(12) United States Patent
Suzuki et al.

(10) Patent No.: US 8,586,467 B2
(45) Date of Patent: Nov. 19, 2013

(54) METHOD OF MOUNTING ELECTRONIC COMPONENT AND MOUNTING SUBSTRATE

(75) Inventors: Osamu Suzuki, Niigata (JP); Seiichi Ishikawa, Niigata (JP); Haruyuki Yoshii, Niigata (JP)

(73) Assignee: Namics Corporation, Niigata (JP)

( * ) Notice: Subject to any disclaimer, the term of this patent is extended or adjusted under 35 U.S.C. 154(b) by 135 days.

(21) Appl. No.: 13/138,582

(22) PCT Filed: Feb. 25, 2010

(86) PCT No.: PCT/JP2010/052991
§ 371 (c)(1),
(2), (4) Date: Sep. 8, 2011

(87) PCT Pub. No.: WO2010/103934
PCT Pub. Date: Sep. 16, 2010

(65) Prior Publication Data
US 2011/0316149 A1    Dec. 29, 2011

(30) Foreign Application Priority Data

Mar. 12, 2009    (JP) ................................. 2009-059618

(51) Int. Cl.
*H01L 21/44*    (2006.01)
*H01L 23/48*    (2006.01)

(52) U.S. Cl.
USPC ........... 438/613; 438/108; 438/612; 438/614; 438/615; 257/737; 257/738; 257/778; 257/E23.021; 257/E23.069; 257/E21.503; 257/E21.508

(58) Field of Classification Search
USPC .................. 257/737, 738, 789, 795, E23.021, 257/E23.069; 438/612–617
See application file for complete search history.

(56) References Cited

U.S. PATENT DOCUMENTS

| | | | |
|---|---|---|---|
| 6,261,501 B1 * | 7/2001 | Miyagawa et al. | ...... 264/272.15 |
| 6,913,945 B2 | 7/2005 | Yamauchi et al. | |
| 2003/0129822 A1 * | 7/2003 | Lee et al. | ...... 438/613 |
| 2004/0047127 A1 | 3/2004 | Yamauchi et al. | |

FOREIGN PATENT DOCUMENTS

| | | |
|---|---|---|
| JP | 11-135671 | 5/1999 |
| JP | 2000-100862 | 4/2000 |
| JP | 2002-203874 | 7/2002 |
| JP | 2002-334906 | 11/2002 |
| JP | 2006-165303 | 6/2006 |
| JP | 2007-056070 | 3/2007 |

* cited by examiner

*Primary Examiner* — Jasmine Clark
(74) *Attorney, Agent, or Firm* — Jordan and Hamburg LLP

(57) ABSTRACT

In flip chip attach of electronic components, underfill is filled between the component and the substrate to alleviate, for example, thermal stress. In electronic component mounting using copper pillars conducted so far, filler contained in the underfill may cause separation in the process of heating and curing the resin. Disclosed is plating the surfaces of the copper pillars with solder. Mobilization of the filler charged in the underfill due to electric fields produced by local cells that are developed upon contact between dissimilar metals, is suppressed, and occurrence of crack at connection portions is obviated. Thus, connection reliability is increased.

19 Claims, 7 Drawing Sheets

(a)

(b)

(c)

METHOD OF MOUNTING ELECTRONIC COMPONENT AND MOUNTING SUBSTRATE

TECHNICAL FIELD

The present invention relates to underfill materials and methods of mounting electronic components for use in mounting electronic components on substrates.

BACKGROUND ART

With further size reduction and sophistication of electronics, there is an increasing demand for high-density mounting of electronic components, e.g., semiconductor chips, on substrates. High-density mounting technologies include a flip chip attach method. According to this method, projection electrodes are formed on a surface of a chip, and the chip is directly connected to the substrate with the surface of the chip faced down. With the flip chip attach method, a semiconductor chip and a substrate are directly connected to each other. Thus, the connection portions may hardly absorb stress caused by a difference in coefficient of linear expansion between the silicon chip and the substrate. In such a case, a crack may be produced in the connection portions. This may result in poor connection reliability. To overcome this problem, a technique is used with which a sealing resin referred to as underfill material is filled between the semiconductor chip and the wiring substrate. The use of underfill material makes for increased reliability of connection against thermal stress such as heat cycles and against physical stress such as impact or bend.

Patent Document 1 discloses an underfill material containing an epoxy resin, a polyfunctional aliphatic epoxy, a basic curing agent, and inorganic filler. Generally, a phenol-based, an acid anhydride-based, and an amine-based curing agents are known as curing agents for epoxy resin. Recently, however, underfill material containing a basic curing agent, e.g., an amine-based curing agent, mixed therein is used in many cases for its high ability to control the glass-transition temperature.

The coefficient of linear expansion of the silicon chip is 4 ppm/° C., and the coefficient of linear expansion of the substrate, e.g., a glass epoxy substrate, is 20 ppm/° C. The filler is mixed in the underfill material to absorb the difference in coefficient of linear expansion. For example, powder of silica, alumina, boron nitride, or aluminum nitride is usually used as the filler.

Meanwhile, recently, copper pillar bumps have come into use particularly in high-density flip chip attach. The copper pillar bumps have, for example, the following advantages: reduced bump pitches as compared with solder bumps used heretofore; minimized environmental impact because of the reduced amount of lead use; a high radiation property because of the high thermal conductivity; and reduced parasitic resistance because of the high electric conductivity.

FIGS. 7(a) to 7(e) are cross-sectional views sequentially illustrating the processes of a method of mounting electronic components by the flip chip attach that has been conducted so far using the copper pillar bumps and underfill. FIG. 7(a) is a cross-sectional view of a wiring substrate 101 with electrode terminals 102 formed on a surface thereof. Resist patterns 103 are formed on this wiring substrate such that the resist patterns 103 fill the spaces between the electrode terminals 102 (FIG. 7(b)). Next, solder bumps 104 are each formed on the electrode terminals 102 (FIG. 7(c)).

Generally, SnPb is used as a material of the solder bumps 104. To address an environmental issue, however, Pb-free SnAgCu is used in some cases. The resist patterns 103 are formed filling up the spaces between the electrode terminals 102. This structure prevents short circuit between the adjacent solder bumps. Next, a bare chip 106 with copper pillars 105 formed on a surface thereof is placed on the wiring substrate 101. The chip substrate 106 and the wiring substrate 101 are aligned to each other. The chip substrate 106 and the wiring substrate 101 are heated at a temperature for joining solder, such that electrical connection is established between the copper pillars 105 and the electrode terminals 102 through the solder bumps 104 (FIG. 7(d)). Next, an underfill material is heated at about 80° C. to turn it into liquid form. The liquid is injected into the spaces between the chip substrate 106 and the wiring substrate 101. Further, the underfill material is heated at about 150° C. to be cured (FIG. 7(e)).

However, when flip chip attach is performed with the copper pillars by using the mounting method as illustrated in FIGS. 7(a) to 7(e), a phenomenon is observed in which the filler contained in the underfill separate in the resin, i.e., the filler is agglomerated in the resin, during heat curing. The phenomenon causes areas with no filler present to be formed in the underfill. Because of this, the difference in coefficient of linear expansion between the silicon chip and the substrate is partially not absorbed, and development of cracks in bumps is brought about.

Patent Document 1: JP-A-2007-56070

SUMMARY OF THE INVENTION

An object of the present invention is to enhance the connection reliability in flip chip attach. The object is achieved by controlling separation of filler in underfill to disperse the filler homogenously or to agglomerate the filler in desired areas, and by curing the underfill in that state.

An aspect (1) relates to a method of mounting an electronic component for connecting the electronic component including metal pillars to a plurality of electrode terminals disposed on a surface of a substrate through solder bumps, the method including: at least coating the surfaces of the metal pillars with solder; and injecting underfill material containing filler into space between the electronic component and the substrate, and heating and curing the underfill material.

An aspect (2) relates to a method of mounting an electronic component for connecting the electronic component including metal pillars to a plurality of electrode terminals disposed on a surface of a substrate through solder bumps, the method including: at least forming resist patterns greater in thickness than the solder bumps between the adjacent electrode terminals; and injecting underfill material containing filler into space between the electronic component and the substrate, and heating and curing the underfill material.

An aspect (3) relates to a method of mounting an electronic component for connecting the electronic component including metal pillars to a plurality of electrode terminals disposed on a surface of a substrate through solder bumps, the method including: injecting underfill material containing filler into space between the electronic component and the substrate; and neutralizing the underfill material and heating and curing the underfill material.

An aspect (4) relates to a method of mounting an electronic component for connecting the electronic component including metal pillars to a plurality of electrode terminals disposed on a surface of a substrate through solder bumps, the method including: at least injecting underfill material containing filler into space between the electronic component and the substrate; and heating and curing the underfill material with a direct electric field being applied thereto.

An aspect (5) relates to a method of mounting an electronic component for connecting the electronic component including metal pillars to a plurality of electrode terminals disposed on a surface of a substrate through solder bumps, the method including: at least injecting underfill material containing filler into space between the electronic component and the substrate; and heating and curing the underfill material with an alternate electric field being applied thereto.

An aspect (6) relates to a method of mounting an electronic component for connecting the electronic component including metal pillars to a plurality of electrode terminals disposed on a surface of a substrate through solder bumps, the method including: at least injecting underfill material containing filler into space between the electronic component and the substrate; and heating and curing the underfill material, wherein the hearing and curing is performed for not less than 30 seconds and not more than one hour.

An aspect (7) relates to the electronic component mounting method of the aspects (1) to (6), wherein the metal pillars are made of copper or gold.

An aspect (8) relates to the electronic component mounting method of the aspects (1) to (7), wherein the underfill material comprises an epoxy-based resin and contains an amine-based curing agent and filler.

An aspect (9) relates to a mounting substrate including: an electronic component including metal pillars; a plurality of electrode terminals disposed on a surface of the substrate; and solder bumps connecting the electronic component with the plurality of electronic terminals, wherein the surfaces of the metal pillars are coated with solder.

An aspect (10) relates to a mounting substrate including: an electronic component including metal pillars; a plurality of electrode terminals disposed on a surface of the substrate; and solder bumps connecting the electronic component with the plurality of electronic terminals, wherein the surfaces of the solder bumps are covered with resist.

An aspect (11) relates to the mounting substrate of the aspect (9), wherein the mounting substrate includes filler-containing underfill material injected in space between the electronic component and the substrate, the underfill material being thermally cured, and the surfaces of the metal pillars are coated with solder so as not for the surfaces of the metal pillars to contact the underfill material.

An aspect (12) relates to the mounting substrate of the aspect (10), wherein the mounting substrate includes filler-containing underfill material injected in space between the electronic component and the substrate, the underfill material being thermally cured, and the surfaces of the solder bumps are covered with resist so as not for the surfaces of the solder bumps to contact the underfill.

An aspect (13) relates to the mounting substrate of the aspects (9) to (12), wherein the metal pillars are made of copper or gold.

An aspect (14) relates to the mounting substrate of the aspects (11) to (13), wherein the underfill material comprises epoxy-based resin and contains amine-based curing agent and filler.

The flip chip attach of electronic components according to the aspects (1) to (8) allows for controlling separation of filler in the underfill for the filler to be dispersed homogenously, or to agglomerate the filler in desired areas. The flip chip attach also allows for curing of the underfill in this state. Accordingly, the connection reliability of flip chip attach is improved.

Figure 1:
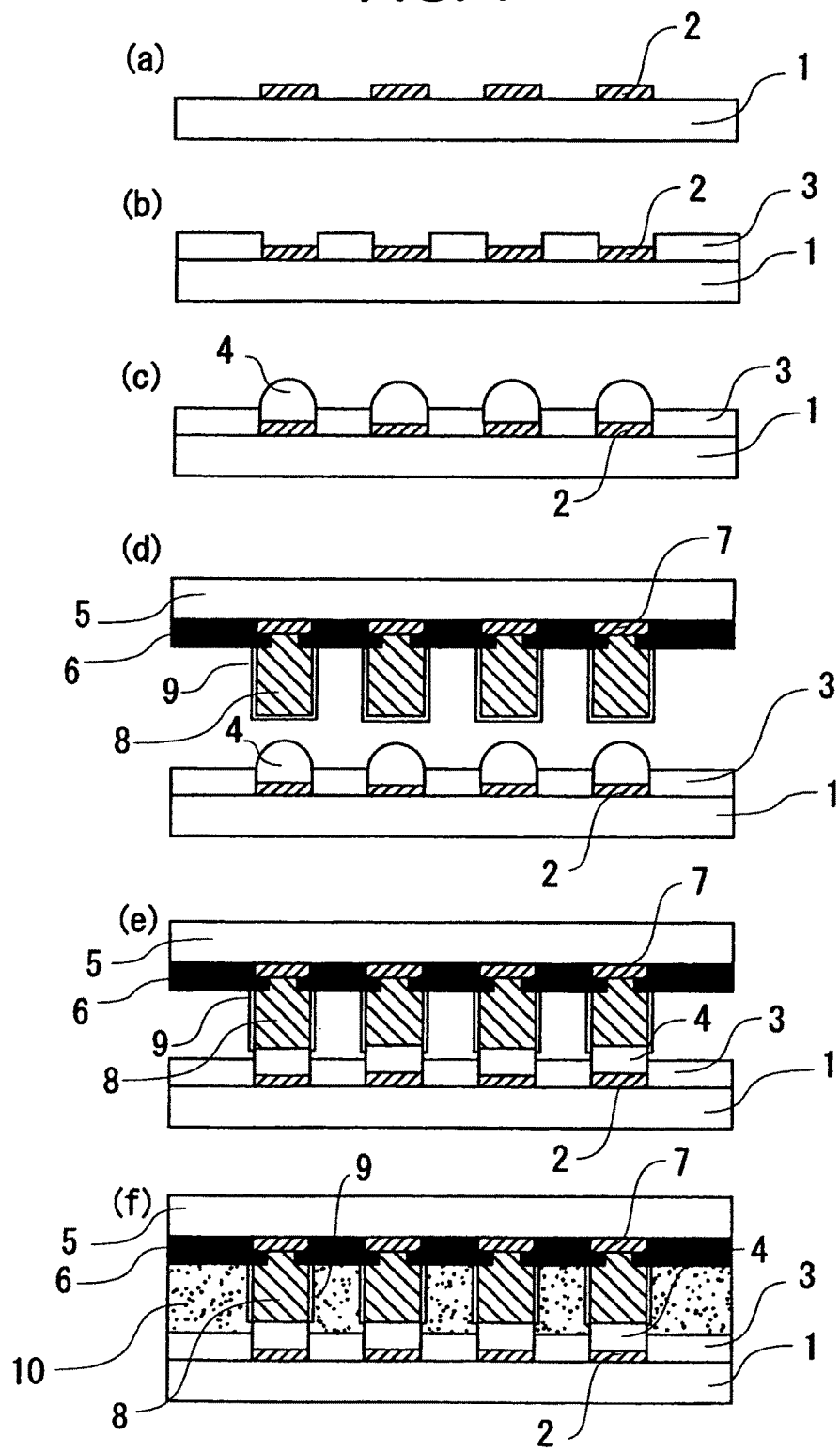
FIGS. 1(a) to 1(f) are cross-sectional views sequentially illustrating a first specific example of the processes of an electronic component mounting method according to the present invention.
Figure 2:
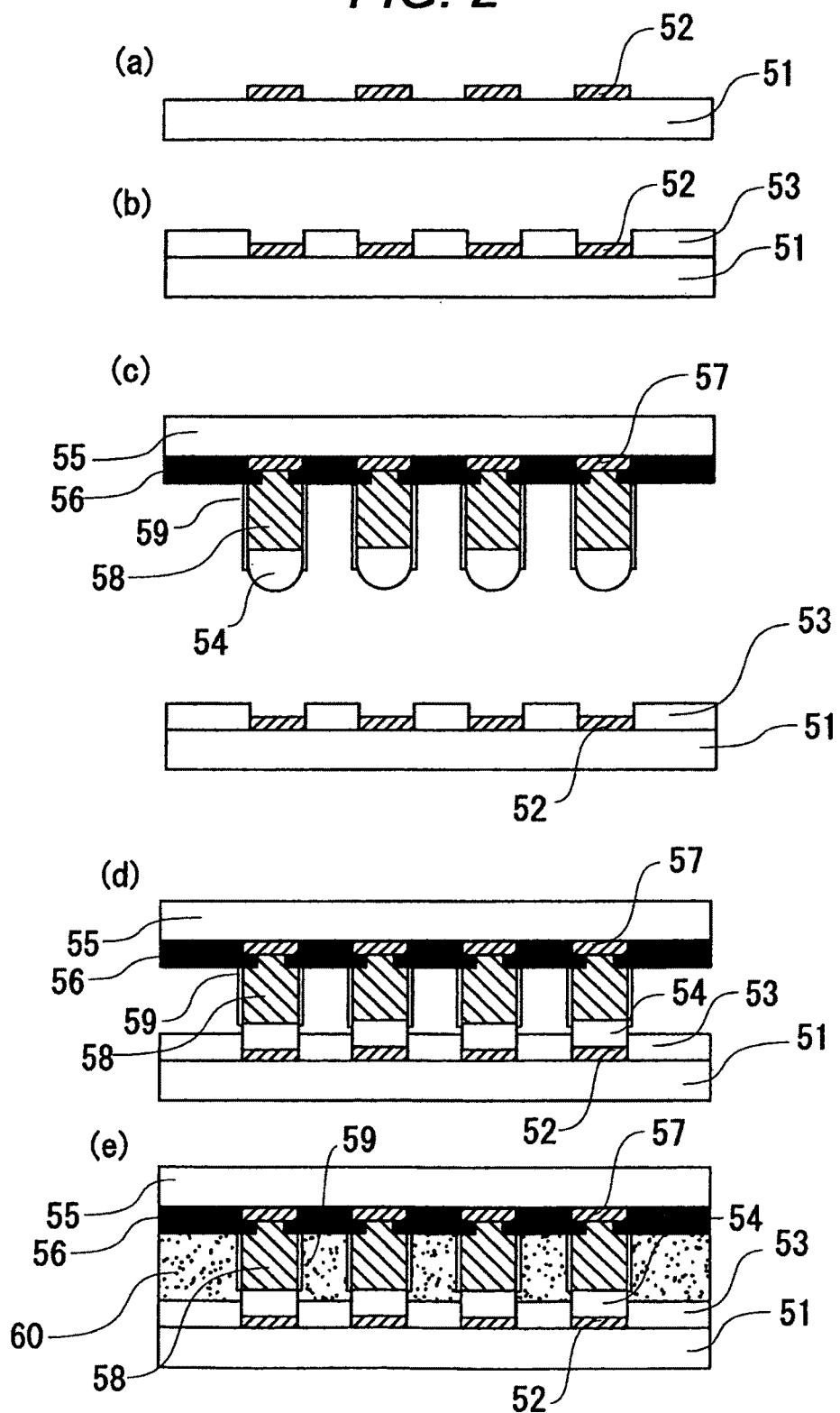
FIGS. 2(a) to 2(e) are cross-sectional views sequentially illustrating a second specific example of the processes of the electronic component mounting method according to the present invention.

DESCRIPTION OF REFERENCE SIGNS 1, 11, 51, 101 wiring substrate
2, 12, 52, 102 electrode terminal
3, 13, 53, 103 resist pattern
4, 18, 54, 104 solder
5, 14, 55, 106 chip substrate
6, 16, 56, 108 passivation
7, 15, 57, 107 electrode terminal
8, 17, 58, 105 copper pillar
9, 59 solder plating
10, 19, 60, 109 underfill
31 wiring substrate
32 resist pattern
33, 43, 48 areas of accumulated filler
42, 47 solder plating film
34, 44, 49 areas with little filler
35 chip substrate
36 electrode terminal
37, 40, 46 solder
38, 41, 45 copper pillar
39 crack

DESCRIPTION OF THE PREFERRED EMBODIMENTS

Embodiments of the present invention are described below.
(Separation of Filler from Underfill Resin)

The inventors observed a cross section of underfill after injecting the underfill in the space between an electronic component using copper pillar bumps and a mounting substrate and heating and curing the underfill. As a result, the inventors discovered a phenomenon in which filler that has been dispersed homogenously in the underfill before the heating becomes agglomerated in the resin, such that filler disappears in the vicinity of the copper pillars. In the solder bump mounting that has been performed before, a portion of filler particles dispersed in the underfill sometimes sinks by the action of gravity during heat curing. In cases of using copper pillar bumps however, it was found that almost all filler particles separate from around the copper pillars with high likelihood of recurrence: As described before, filler failing to disperse homogenously in the underfill resin may hinder adequate absorption of difference in coefficient of linear expansion between the electronic component and the substrate.

Figure 4:
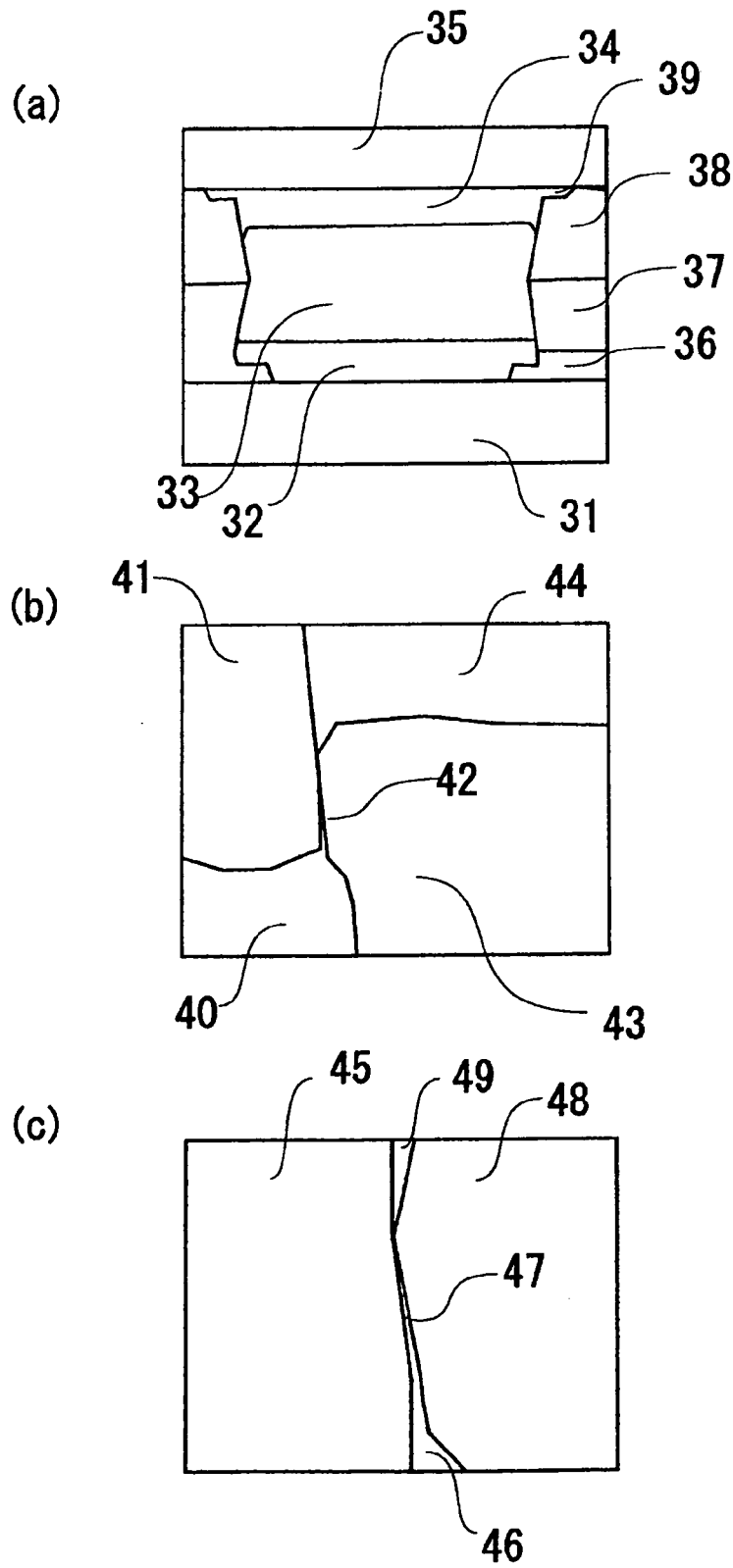
FIGS. 4(a) to 4(c) are cross-sectional views of underfill scanned from scanning electron microscope (SEM) photos, in which views separation occurs between filler and resin.

FIGS. 4(a) to 4(c) are cross-sectional views of underfill scanned from SEM photos, in which views separation occurs between filler and resin. In FIG. 4(a), underfill 33 and 34 is filled in the space between a wiring substrate 31 and a chip substrate 35 of an electronic component. The wiring substrate 31 and the chip substrate 35 are electrically connected to each other through copper pillars 38, solder 37, and electrode terminals 36. A resist pattern 32 is formed between the adjacent electrode terminals 36. It is observed that filler is dispersed homogeneously in the underfill before heat curing, but that, after heat curing, separation occurs in the underfill into an area 34 with little filler and an area 33 with filler accumulation. FIGS. 4(b) and 4(c) are enlarged views of FIG. 4(a). It is seen that filler has moved to separate from the surfaces of the copper pillars based on the positional relationship among the areas 43 and 48 with filler accumulation, areas 44 and 49 with little filler, copper pillars 41 and 45, and solder 40 and 46. It is also seen that separation of filler does not occur in portions covered with solder films, (solder plating films) 42 and 47, which portions constitute part of the surfaces of the copper pillars 41 and 45, respectively.

Such separation of filler was rarely observed in cases of using a phenol-based curing agent or acid anhydride-based curing agent. Further, it was understood that separation of filler occurs frequently in cases where the heating temperature of the underfill cannot be raised from 170° C. due to restraints stemming from the mounting process, such as the heat durability of the solder and resist to be used. An amine-based curing agent generally has low capability of accelerating curing as compared with phenol-based curing agents and acid anhydride-based curing agents, and thus takes longer time for curing. For example, in case of using a phenol-based curing agent, curing takes about 30 minutes' heating at a temperature of 150° C. Meanwhile, in case of using an amine-based curing agent, curing takes about one to two hour's heating at 150° C. In other words, it was understood that separation occurs in cases of longer curing periods.

(Experimental Causal Inspection 1)

Figure 5:
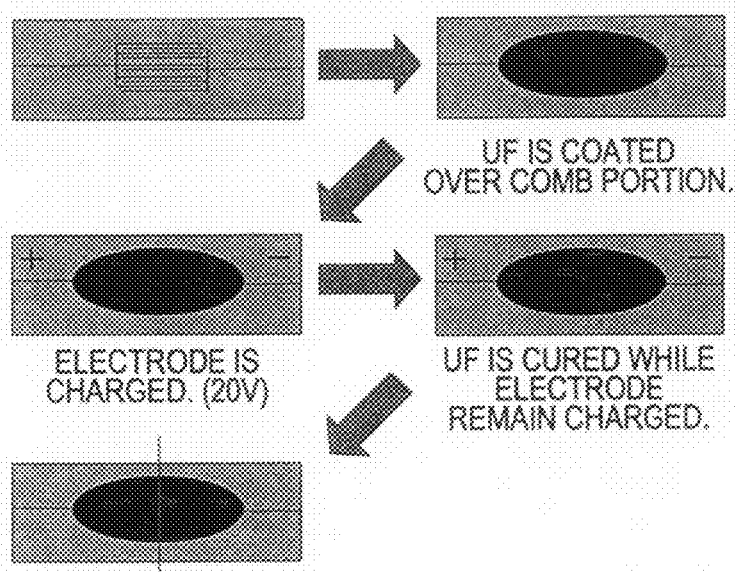
FIG. 5(a) is an explanatory view of an experimental method for inspection of what kind of influence charges have on the separation between the filler and the resin.
FIGS. 5(b) and 5(c) are SEM photos showing results of the experiment.
Figure 5:
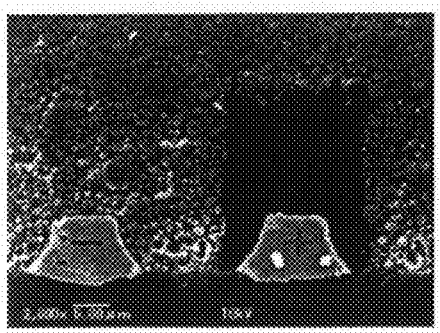
Figure 5:
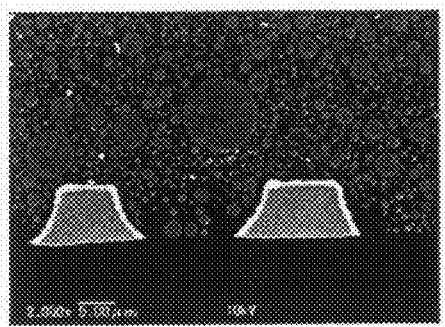

The inventors conducted an experimental causal inspection on the assumption that the separation of filler is caused by formation of local cells due to filler's contact on a dissimilar metal. FIG. 5(a) is an explanatory view of an experimental method for inspection of what kind of influence charges have on the separation between filler and resin. First, a substrate with a comb electrode printed on a surface thereof is prepared, and underfill (UF) is coated over the comb electrode. Next, a direct voltage (20 V) is applied to the electrode to charge the underfill. The underfill is thermally cured in this condition. FIG. 5(b) is a cross-sectional view of an experimental piece in the case that voltage is applied. A negative voltage application electrode is on the left, and a positive voltage application electrode is on the right. It is seen that filler is not in the vicinity of the positive voltage application electrode. FIG. 5(c) is a cross-sectional view of an experimental piece in the case that voltage is not applied. It can be seen that no conspicuous difference in filler distribution is produced even in the vicinity of each of two adjacent electrodes. As a result of this experiment, it was seen that charged filler dispersed in the underfill is likely to separate from the resin by the repellant action caused by local cells.

(Experimental Causal Inspection 2)

Figure 6:
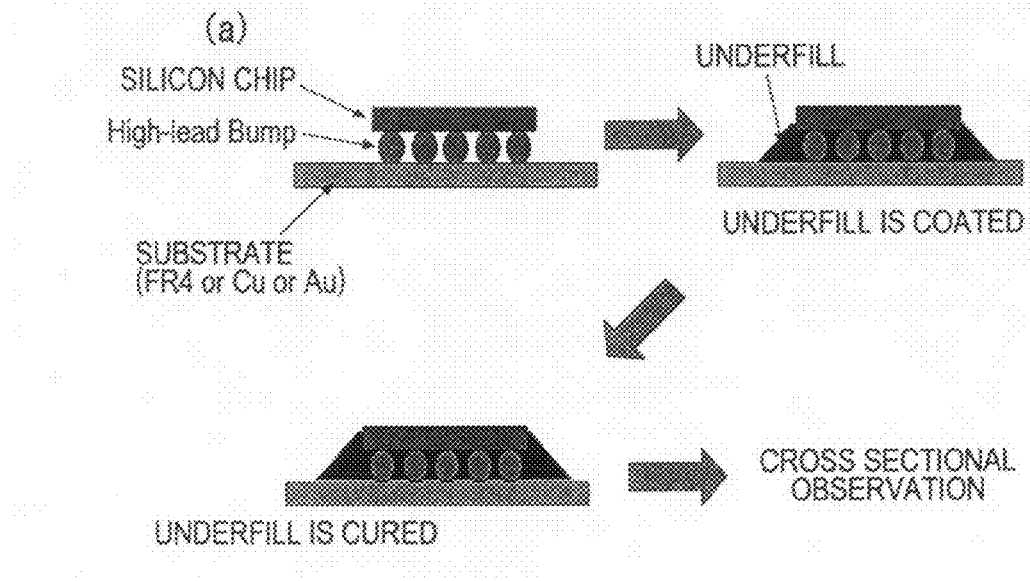
FIG. 6(a) is an explanatory view of an experimental method of inspection as to what kind of influence local cells have on the separation between the filler and the resin.
FIGS. 6(b) to 6(d) are SEM photos showing results of the experiment.
Figure 6:
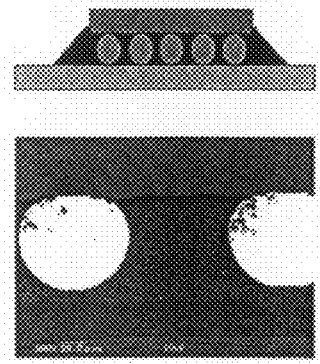
Figure 6:
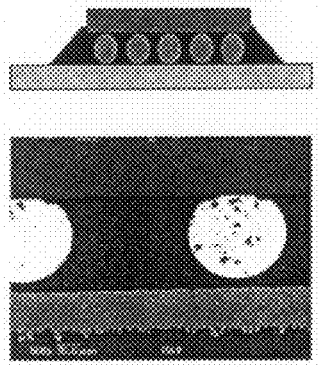
Figure 6:
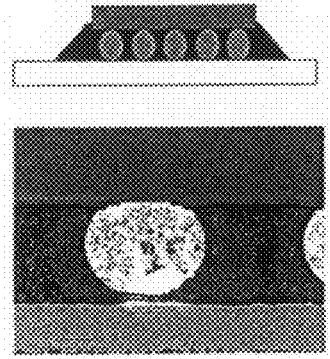
Figure 7:
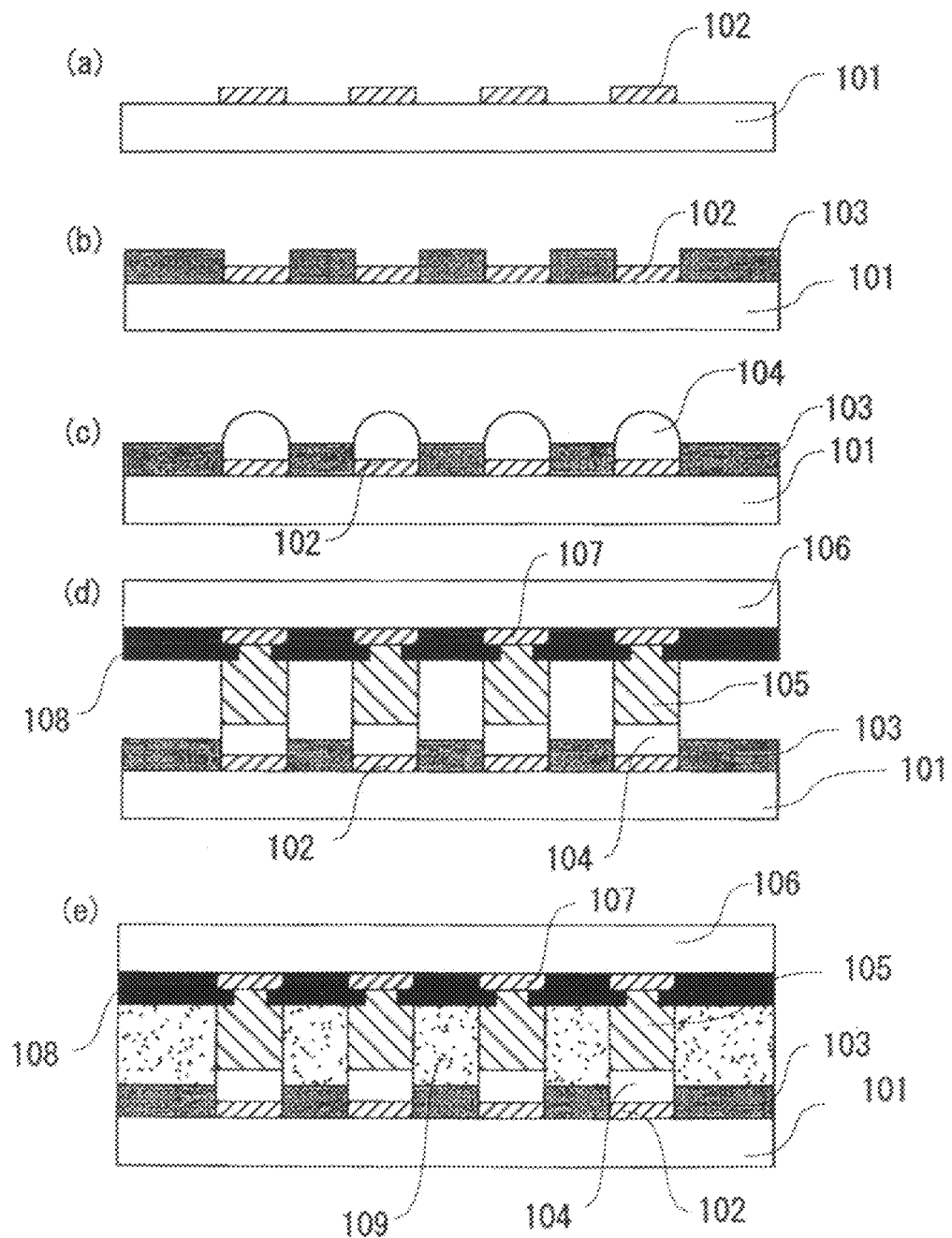
FIGS. 7(a) to 7(e) are cross-sectional views lined in an order of the processes of an electronic component mounting method that has been used so far.

In order to confirm that separation of filler is caused by local cells due to contact with a dissimilar metal, experimental inspection was further conducted. FIG. 6(a) is an explanatory view of an experimental method of inspection as to what kind of influence a local cell has on the separation between filler and resin. First, a sample is prepared by placing solder bumps (Pb/Sn) on a substrate and mounting a silicon chip on the bumps. Samples were prepared using three different substrates, FR4 (glass epoxy substrate), copper, and gold, as substrate materials, respectively. Next, underfill is injected into the spaces between the silicon chips and the substrates, and thermally cured, followed by being subjected to cross-sectional observation by SEM. FIGS. 6(b) to 6(d) are SEM photos showing results of the experiment. When the material of the substrate is FR4, separation of filler was not observed. Meanwhile, when the material of the substrate is copper or gold, it was found that filler separation occurred in such a way that filler separates from copper or gold to approach solder. Based on the result, it was confirmed that separation of filler occurs due to local cells that are produced upon contact of filler with dissimilar metals. Further, separation of filler occurs not only in case of using copper pillar bumps but also in case of using pillars made of gold and in case of performing connection with gold wire. Moreover, it is speculated that separation of filler will occur in case where metals of two or more different kinds of metals besides copper or gold are made into contact with underfill.

(First Specific Example of a Mounting Method of the Present Invention)

The inventors sought for means for solving the problems based on the findings acquired with regard to the filler separation. As a result, a plurality of solving methods was successfully found out, and evaluation was conducted using these methods. Consequently, it was confirmed that the methods are actually useful for solving the problem.

First solving means of the present invention is a method of preventing contact of copper on underfill, which is achieved by plating the surfaces of copper pillars with solder. FIGS. 1(a) to 1(f) are cross-sectional views sequentially illustrating the processes of a first specific example of the electronic component mounting method according to the present invention. First, a wiring substrate 1 with electrode terminals 2 formed on a surface thereof is prepared (FIG. 1(a)). The material of the wiring substrate is, for example, FR4 (glass epoxy substrate). Then, resist patterns 3 are formed on the exposed surface portions of the wiring substrate 1 excluding the electrode terminal 2 portions (FIG. 1(b)). Next, bumps 4 made of solder are formed on the electrode terminals 2 (FIG. 1(c)). Subsequently, an electronic component with pillars formed on a surface thereof (e.g., semiconductor chip) is placed on the wiring substrate 1 and is aligned to the wiring substrate 1, such that the surface having the pillars formed thereon opposes the solder bumps 4 on the wiring substrate 1 (FIG. 1(d)). In the semiconductor chip, electrode terminals 7 are on a chip substrate 5, and copper pillars 8 are formed in connection with the electrode terminals 7. The surfaces of the copper pillars 8 are plated with solder and are covered with solder films 9. Next, the copper pillars 9 are joined with the solder bumps 4 (FIG. 1(e)). Finally, underfill material, which has been heated into liquid in advance, is injected between the space created between the semiconductor chip and the wiring substrate. Further, the underfill material is heated to a curing temperature of the resin to be cured (FIG. 1(f)). The metal that contacts the underfill 10 is limited to solder. Accordingly, local cells are not developed, and the separation of filler will not occur.

(Materials of Underfill)

Examples of materials of the underfill that is applicable to the present mounting method and also is effective in prevention of filler separation include the below described materials. An underfill material is prepared by mixing a resin, a curing agent, and filler. In some cases, underfill may be prepared by additionally blending a diluent and/or an accelerator. The present mounting method is not limited to the materials described below. In case of using a material other than those described below, an excellent filler separation-prevention effect can be obtained.

[Resin]

For example, epoxy resin is preferably used as a resin constituting the underfill. The epoxy resin is not specifically limited so far as it is an epoxy compound that has two or more epoxy groups in one molecule, and that it is curable into the form of resin. Specific examples of the epoxy resin include bisphenol A epoxy resin, brominated bisphenol A epoxy resin, bisphenol F epoxy resin, biphenyl epoxy resin, novolac epoxy resin, alicyclic epoxy resin, naphthalene epoxy resin, ether-based or polyether-based epoxy resin, oxirane ring-containing polybutadiene, and silicone epoxy copolymer resin.

[Diluent]

In case of using diluent, either a nonreactive diluent or a reactive diluent can be used. Among them, the reactive diluent is more preferably used. A reactive diluent is a compound that has one or more epoxy groups in one molecule and relatively low viscosity at normal temperature. Depending on the purpose, the reactive diluent may have another polymerizable functional group, e.g., an alkenyl group such as vinyl or aryl; or an unsaturated carboxylic residue such as acryloyl or metacryloyl, in addition to an epoxy group. Examples of such reactive diluent include monoepoxide compounds, such as n-butylglycidyl ether, 2-etylhexylglycidyl ether, phenylglycidyl ether, cresylglycidyl ether, p-s-butylphenylglycidyl ether, styrene oxide, and α-pinene oxide; monoepoxides compound having a functional group, such as arylglycidyl ether, glycidyl methacrylate, and 1-vinyl-3,4-epoxy cyclohexane; diexpoxide compounds, such as (poly)ethylenegly-col diglycidylether, (poly)propylene glycol diglycidyl ether, butanediol glycidyl ether, and neopentyl glycol glycidyl ether; and triepoxide compounds, such as trimethylolpropane triglycidyl ether, and glycerin triglycidyl ether.

[Curing Agent]

In case of using epoxy resin as a resinous material of underfill, phenol resin, acid anhydride, or amine-based compound may be used as curing agent.

Examples of phenol resin include phenol novolac resin, cresol novolac resin, naphthol-modified phenol resin, dicyclopentadiene-modified phenol resin, and p-xylene-modified phenol resin. Phenol resin is not however limited to the above examples, and any phenol resin that is normally used in resinous compositions for underfill may be used.

The OH-equivalent weight in phenol resin is preferably 0.3 to 1.5 equivalents per equivalent of the epoxy group in the epoxy resin, more preferably, 0.5 to 1.2 equivalents.

Examples of acid anhydride include methyltetrahydrophthalic anhydride, methylhexahydrophthalic anhydride, alkylated tetrahydrophthalic anhydride, hexahydrophthalic anhydride, anhydrous methyl HIMIC acid, dodecenyl succinic anhydride, and methyl nadic anhydride.

The blending proportion of the epoxy resin and the acid anhydride is preferably 0.6 to 1.0 equivalents of the acid anhydride for one equivalent weight of the epoxy group in the epoxy resin.

Examples of amine-based compounds include aliphatic polyamine; aromatic amine; and modified polyamine, such as polyamino-amido, polyamino-imido, polyamidno esther, and polyamino urea. However, amine-based compounds are not limited to the above examples. Alternatively, tertiary amine-based, imidazole-based, hydrazide-based, dicyandiamide-based, or melamine-base compound may be used as the amino-based compound.

The blending proportion of the epoxy resin and the amine-based compound is preferably 0.6 to 1.0 equivalents of the amine-based compound per equivalent of the epoxy group in the epoxy resin.

In addition, these curing agents may be used alone or two or more of them may be used in combination.

[Accelerator]

Accelerator may be used in the underfill material as needed. Examples of the accelerator include imidazole-based, tertiary amine-based, and phosphorous compound-based compounds. For example, the accelerator may be 2-methylimidazole, 2-undecylimidazole, 2-heptadecylimidazole, 2-ethyl-4-methylimidazole, 2-phenylimidazole, or 2-phenyl-4-methylimidazole, but not specifically limited thereto. The blending amount of the accelerator in the resin composition is preferably 0.05 to 30% per weight of the total resin composition. Further, these accelerators may be used alone, or two or more of them may be used in combination.

[Filler]

Examples of the filler to be blended in the underfill material include molten silica, aluminum nitride, and molten alumina. The filler preferably has a substantially spherical shape. The average particle size of the filler is preferably in a range of 0.2 μm to 20 μm. The shape and the average particle size of the filler is preferably set appropriately depending on the design of the semiconductor and the sealing method used therefor. Alternatively, fillers of different materials and with different particle sizes may be blended for use.

In the underfill material, for example, a silane coupling agent, surface active agent, or elastomer may be blended appropriately in addition to the filler.

(Second Specific Example of a Mounting Method of the Present Invention)

The second specific example of the present mounting method is a variation of the first specific example. The second specific example is different from the first specific example in that solder bumps are formed on the side of the semiconductor chip and not on the side of the wiring substrate.

FIGS. 2(a) to 2(e) are cross-sectional views sequentially illustrating the processes of a second specific example of the electronic component mounting method according to the present invention. First, a wiring substrate 51 with electrode terminals 52 formed on a surface thereof is prepared (FIG. 2(a)). Next, resist patterns 53 are formed on the exposed surface portion of the wiring substrate 51 excluding the electrode terminal 52 portions (FIG. 2(b)). Subsequently, an electronic component with pillars and solder bumps formed on a surface thereof (e.g., semiconductor chip) is placed on the wiring substrate 51 and aligned thereto, such that the surface on which the pillars and solder bumps are formed opposes the electrode terminals 52 on the wiring substrate 51 (FIG. 2(c)). The semiconductor chip has electrode terminals 57 on a chip substrate 55. Copper pillars 58 are formed in connection with the electrode terminals 57. Solder bumps 54 are formed in connection with the copper pillars 58. The surfaces of the copper pillars 58 are plated with solder and are covered with solder films 59. Next, the solder bumps 54 are joined to the electrode terminals 52 (FIG. 2(*d*)). Lastly, underfill is heated into liquid and is injected into the space created between the semiconductor chip and the wiring substrate. Further, the underfill is heated to the curing temperature of the resin to be cured (FIG. 2(*e*)). The metal that contacts the underfill 60 is limited to solder. Accordingly, local cells are not developed, and separation of filler will not occur.

(Third Specific Example of an Electronic Component Mounting Method of the Present Invention)

Figure 3:
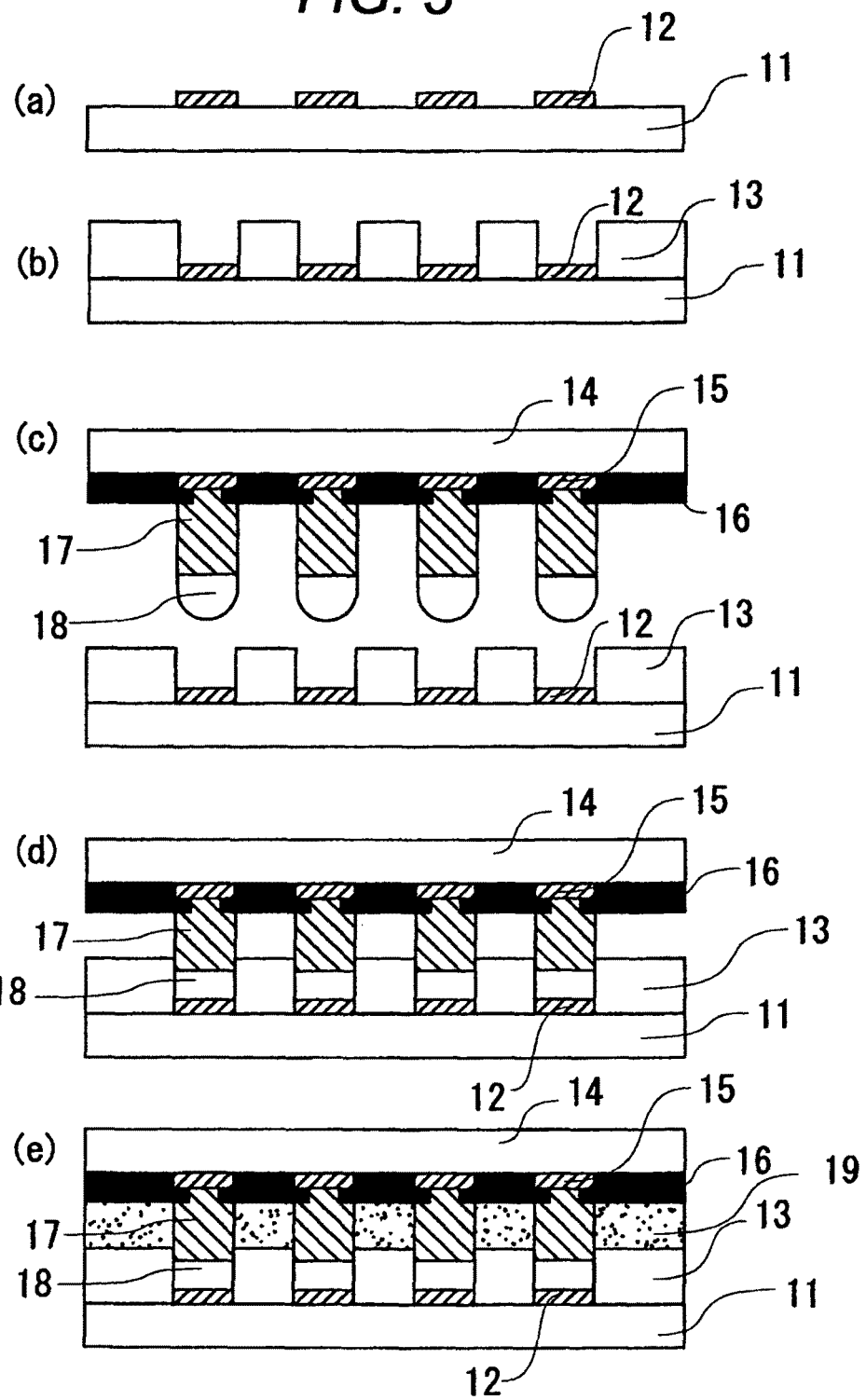
FIGS. 3(a) to 3(e) are cross-sectional views sequentially illustrating a third specific example of the processes of the electronic component mounting method according to the present invention.

According to the second solving means of the present invention, resist for preventing short circuit of solder is formed to a greater thickness. The resist formed to have a greater thickness is capable of preventing separation of filler, for the resist with a greater thickness can prevent solder from contacting underfill. FIGS. 3(*a*) to 3(*e*) are cross-sectional views sequentially illustrating the processes of a third specific example of the electronic component mounting method according to the present invention. First, a wiring substrate 11 with electrode terminals 12 formed on a surface thereof is prepared (FIG. 3(*a*)). Next, resist patterns 13 are formed on the exposed surface portion of the wiring substrate 11 excluding the electrode terminal 12 portions (FIG. 3(*b*)). Subsequently, an electronic component with pillars and solder bumps formed on a surface thereof (e.g., semiconductor chip) is placed on the wiring substrate 11 and is aligned to the wiring substrate 11, such that the surface having the pillars and solder bumps formed thereon opposes the electrode terminals 12 on the wiring substrate 11 (FIG. 3(*c*)). The semiconductor chip has electrode terminals 15 on a chip substrate 14. Copper pillars 17 are formed in connection with the electrode terminals 15. In addition, solder bumps 18 are formed in connection with the copper pillars 17. Next, the solder bumps 18 are joined to the electrode terminals 12 (FIG. 3(*d*)). In the method of forming the resist patterns illustrated in FIG. 3(*b*), the resist patterns 13 are formed to have a greater thickness than the solder bumps compressed in the process illustrated in FIG. 3(*d*) and to have such a thickness as to cover the solder bumps completely. Lastly, the underfill is heated into liquid and is injected into the space created between the semiconductor chip and the wiring substrate. Further, the underfill is heated to the resin curing temperature to be cured (FIG. 3(*e*)). The metal that contacts the underfill 19 is limited to copper. Accordingly, local cells are not produced, and separation of filler will not occur.

According to the second solving means of the present invention, the process of plating the surfaces of the copper pillars with solder is eliminated. For this reason, manufacturing cost can be reduced.

(Other Specific Example of the Present Invention)

The inventors have devised various problem-solving means in addition to the above-described specific examples, based on the recognized principle on filler separation. Further, the inventors have conducted experiments for confirmation of effects thereof, and have successfully confirmed that prominent effects can be obtained through any of these methods. In addition, improvement in underfill materials helps prevent filler separation, besides improvement in the mounting method. Specific examples of mounting methods and underfill materials of the present invention are described below in addition to those described above.

(1) Neutralization

Neutralization is performed on the underfill material at the stage wherein the underfill material is prepared or during the period from injection of the underfill material into the space between the electronic component and the wiring substrate to curing of the resin. It was found that the neutralization is preventable of filler separation by eliminating static electricity that has produced in the filler. Specific examples of neutralization means include corona discharge and ultraviolet irradiation.

(2) Direct Voltage Application

It was found that filler separation is preventable in such a manner as to negate the voltage of local cells that are produced upon contact of dissimilar metals, by curing the underfill with direct voltage being applied between electrode terminals. For example, in case that copper pillars and solder bumps contact the underfill material, a voltage of 0.1 to several volts is applied with the copper side as negative voltage and the solder side as positive voltage. In this way, filler separation becomes preventable.

(3) Alternate Voltage Application

It was found that filler separation becomes preventable by curing the underfill with alternate voltage being applied to electrode terminals. The voltage and frequency to be applied is set appropriately in consideration of, for example, the materials of the underfill and the metal, and curing conditions.

(4) Shortening of Curing Period

It was found that filler separation becomes preventable by shortening the curing period. The curing period is preferably not less than 30 seconds and not more than one hour. Specific examples of methods for shortening curing period include raising the curing temperature and putting in an accelerator.

(5) Putting in a Material that Suppresses Mobilization of Filler

It was found that filler separation becomes preventable by putting into the underfill material an additive that is capable of suppressing mobilization of filler even when an electric field is applied.

Needless to say, the above-listed means for solving the problems of filler separation according to the present invention is effective when it is adopted as a method for preventing filler separation in any flip chip attach wherein a dissimilar metal contacts the underfill material. For example, the means is effective even in cases where pillars are not made of copper or gold, where bumps are not of solder, and where curing agent contained in the underfill is not an amine-based curing agent.

Further, inability to control filler separation has been a problem, rather than the filler separation itself. Thus, connection failure occurred due to inability to collect filler at a place where agglomeration of filler is desired, such as connection portion of electrodes. Filler may be dispersed homogenously in resin by using the problem-solving means of the present invention. In addition, enhancement in reinforcing property of bumps is also possible by controlling filler distribution, for example, by increasing the concentration of filler at a place where agglomeration of filler is desired.

As has been described, according to the present invention, separation of filler in underfill is controlled, so as to achieve homogenous dispersion of filler or agglomeration of filler in an area where the presence of filler is needed, whereon the filler is cured. In this manner, connection reliability in flip chip attach can be increased.

The invention claimed is:

1. A method of mounting an electronic component, the method comprising:
   connecting the electronic component with metal pillars to electrode terminals disposed on a surface of a substrate through solder bumps, the connecting includes:
   injecting underfill material containing filler into space between the electronic component and the substrate in a manner that covers the metal pillars;

thermally curing the underfill material, and
controlling against separation of said filler from the metal pillars during curing.

2. The method of mounting an electronic component according to claim 1, wherein
the controlling separation includes accelerating curing of the underfill material.

3. The method of mounting an electronic component according to claim 1, wherein
the metal pillars are made of copper or gold.

4. The method of mounting an electronic component according to claim 1, wherein
the controlling separation includes agglomerating the filler on a connection portion of the underfill material with the electrode terminals.

5. A method of mounting an electronic component, the method comprising:
connecting the electronic component with metal pillars to electrode terminals disposed on a surface of a substrate through solder bumps, the connecting includes:
injecting underfill material containing filler into space between the electronic component and the substrate, and thermally curing the underfill material, and
controlling separation of filler in the underfill material and
wherein the controlling separation includes preventing contact of two or more different metals on the underfill material.

6. The method of mounting an electronic component according to claim 5, wherein
the preventing contact includes plating surfaces of the metal pillars with solder.

7. The method of mounting an electronic component according to claim 5, wherein
the preventing contact includes forming resist patterns greater in thickness than the solder bumps between the adjacent electrode terminals.

8. A method of mounting an electronic component, the method comprising:
connecting the electronic component with metal pillars to electrode terminals disposed on a surface of a substrate through solder bumps, the connecting includes:
injecting underfill material containing filler into space between the electronic component and the substrate, and thermally curing the underfill material, and
controlling separation of filler in the underfill material; and
wherein the controlling separation includes neutralizing the underfill material.

9. A method of mounting an electronic component, the method comprising:
connecting the electronic component with metal pillars to electrode terminals disposed on a surface of a substrate through solder bumps, the connecting includes:
injecting underfill material containing filler into space between the electronic component and the substrate, and thermally curing the underfill material, and
controlling separation of filler in the underfill material; and
wherein the controlling separation includes curing the underfill material with alternating voltage or direct voltage being applied between the electrode terminals.

10. A method of mounting an electronic component, the method comprising:
connecting the electronic component with metal pillars to electrode terminals disposed on a surface of a substrate through solder bumps, the connecting includes:
injecting underfill material containing filler into space between the electronic component and the substrate, and thermally curing the underfill material, and
controlling separation of filler in the underfill material; and
wherein the controlling separation includes accelerating curing of the underfill material; and
wherein the accelerating curing uses a curing temperature at which the underfill material is cured within not less than 30 seconds and not more than one hour.

11. A method of mounting an electronic component, the method comprising:
connecting the electronic component with metal pillars to electrode terminals disposed on a surface of a substrate through solder bumps, the connecting includes:
injecting underfill material containing filler into space between the electronic component and the substrate, and thermally curing the underfill material, and
controlling separation of filler in the underfill material; and
wherein the controlling separation includes accelerating curing of the underfill material;
wherein the accelerating curing includes addition of an accelerator;
wherein the underfill material is an underfill material containing an epoxy-based resin; and
wherein the accelerator is an amine-based accelerator.

12. A mounting substrate with an electronic component mounted thereon, the mounting substrate comprising:
the electronic component including metal pillars coated with solder films;
electrode terminals;
solder bumps connecting the metal pillars with the electrode terminals; and
a filler-containing underfill material injected in space between the electronic component and the substrate, wherein the filler is substantially uniformly dispersed in the underfill material, and wherein the underfill material with the uniformly dispersed filler therein is in contact with the metal pillars without gaps occurring therebetween.

13. The mounting substrate according to claim 12, wherein the underfill material contacts one kind of metal.

14. The mounting substrate according to claim 12, wherein the metal pillars are made of copper or gold.

15. The mounting substrate according to claim 13, wherein resist patterns greater in thickness than the solder bumps are formed between the electrode terminals.

16. A mounting substrate with an electronic component mounted thereon, the mounting substrate comprising:
the electronic component including metal pillars;
electrode terminals;
solder bumps connecting the electronic component with the electrode terminals; and
a filler-containing underfill material injected in space between the electronic component and the substrate; and
wherein the filler is substantially uniformly dispersed in the underfill material;
wherein the underfill material contacts one kind of metal; and
wherein the surfaces of the metal pillars are coated with solder films.

17. A mounting substrate with an electronic component mounted thereon, the mounting substrate comprising:
the electronic component including metal pillars;
electrode terminals;
solder bumps connecting the electronic component with the electrode terminals; and
a filler-containing underfill material injected in space between the electronic component and the substrate; and
wherein the filler is substantially uniformly dispersed in the underfill material; and
wherein the underfill material is neutralized.

18. A mounting substrate with an electronic component mounted thereon, the mounting substrate comprising:
   the electronic component including metal pillars;
   electrode terminals;
   solder bumps connecting the electronic component with the electrode terminals; and
   a filler-containing underfill material injected in space between the electronic component and the substrate; and
   wherein the filler is substantially uniformly dispersed in the underfill material; and
   wherein the underfill material contains an accelerator.

19. The mounting substrate according to claim 18, wherein the underfill material is an undefill material containing an epoxy-based resin, and
   the accelerator is an amine-based accelerator.

* * * * *